US010192981B2

(12) United States Patent
Kudymov et al.

(10) Patent No.: US 10,192,981 B2
(45) Date of Patent: Jan. 29, 2019

(54) SWITCHING DEVICE WITH CHARGE DISTRIBUTION STRUCTURE

(71) Applicant: Power Integrations, Inc., San Jose, CA (US)

(72) Inventors: Alexey Kudymov, Ringoes, NJ (US); Jamal Ramdani, Lambertville, NJ (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 15/448,724

(22) Filed: Mar. 3, 2017

(65) Prior Publication Data
US 2017/0179273 A1    Jun. 22, 2017

Related U.S. Application Data

(63) Continuation-in-part of application No. 15/388,812, filed on Dec. 22, 2016, now abandoned, which is a (Continued)

(51) Int. Cl.
*H01L 29/778* (2006.01)
*H01L 29/66* (2006.01)
(Continued)

(52) U.S. Cl.
CPC ...... *H01L 29/7787* (2013.01); *H01L 29/0619* (2013.01); *H01L 29/404* (2013.01); (Continued)

(58) Field of Classification Search
CPC .......... H01L 29/7787; H01L 29/1033; H01L 29/404; H01L 29/42332; H01L 29/42356; (Continued)

(56) References Cited

U.S. PATENT DOCUMENTS 5,192,986 A    3/1993  Ando
5,731,627 A *  3/1998  Seok ............... H01L 29/404
                                                 257/630
(Continued)

FOREIGN PATENT DOCUMENTS

CN    101320751 A    12/2008
CN    101414633 A     4/2009

OTHER PUBLICATIONS

Pytel, Lentijo, Koudymov, Rai, Fatima, Adivarahan, Chitnis, Yang, Hudgins, Santi, Monti, Simin, Khan, "AlGaN/GaN MOSHFET integrated circuit power converter". Proceedings of IEEE Power Electronics Spec. Conference (PESC'04), pp. 579-584, 2004.
(Continued)

*Primary Examiner* — Didarul Mazumder
(74) *Attorney, Agent, or Firm* — Stuart H. Mayer; Mayer & Williams PC

(57) ABSTRACT

A semiconductor device includes a substrate and a first active layer disposed over the substrate. The semiconductor device also includes a second active layer disposed on the first active layer such that a lateral conductive channel arises between the first active layer and the second active layer. a source, gate and drain contact are disposed over the second active layer. A conductive charge distribution structure is disposed over the second active layer between the gate and drain contacts. The conductive charge distribution structure is capacitively coupled to the gate contact.

19 Claims, 10 Drawing Sheets

Related U.S. Application Data continuation of application No. 13/537,407, filed on Jun. 29, 2012, now abandoned.

(51) Int. Cl.
  *H01L 29/40* (2006.01)
  *H01L 29/06* (2006.01)
  *H01L 29/20* (2006.01)

(52) U.S. Cl.
  CPC .... *H01L 29/66462* (2013.01); *H01L 29/7786* (2013.01); *H01L 29/2003* (2013.01)

(58) Field of Classification Search
  CPC .......... H01L 29/4238; H01L 29/66462; H01L 29/7786
  USPC .......................................................... 257/76
  See application file for complete search history.

(56) References Cited

U.S. PATENT DOCUMENTS

| | | | |
|---|---|---|---|
| 6,307,232 | B1 | 10/2001 | Akiyama et al. |
| 6,507,051 | B1 | 1/2003 | Hara |
| 7,525,178 | B2 | 4/2009 | Kulinsky |
| 7,777,305 | B2 | 8/2010 | Kuroda et al. |
| 8,569,842 | B2 | 10/2013 | Weis et al. |
| 9,245,879 | B2 | 1/2016 | Kudymov et al. |
| 9,425,195 | B2 | 8/2016 | Kudymov |
| 9,691,755 | B2 | 6/2017 | Kudymov |
| 2005/0161761 | A1 | 7/2005 | Hatade |
| 2008/0272443 | A1 | 11/2008 | Hoshi et al. |
| 2009/0045438 | A1 | 2/2009 | Inoue |
| 2010/0163987 | A1* | 7/2010 | Nakagawa .......... H01L 29/7824 257/341 |
| 2011/0062495 | A1 | 3/2011 | Koudymov |
| 2011/0103148 | A1 | 5/2011 | Bhalla et al. |
| 2011/0114997 | A1 | 5/2011 | Wu et al. |
| 2011/0221011 | A1* | 9/2011 | Bahat-Treidel ....... H01L 29/404 257/409 |
| 2012/0018735 | A1 | 1/2012 | Ishii |
| 2012/0153361 | A1 | 6/2012 | Ahn et al. |
| 2012/0217544 | A1* | 8/2012 | Ohki ..................... H01L 29/402 257/194 |
| 2012/0217581 | A1 | 8/2012 | Kondou |
| 2012/0235210 | A1 | 9/2012 | Takemae et al. |
| 2013/0127521 | A1 | 5/2013 | Simin et al. |
| 2014/0001515 | A1 | 1/2014 | Koudymov |

OTHER PUBLICATIONS

Lee, Ha, Her, Lim, Seo, Han, "An AlGaN/GaN HEMT power switch employing a field plate and a floating gate", Physica Scripta, V. 126, pp. 65-67, Aug. 2006.
Simin, Tipimeni, Rai, Koudymov, Adivarahan, Yang, Khan, "1.5 kV Power AlGaN/GaN HFETs", 2005 International Semiconductor Device Research Symposium, ISDRS'2005 Abstract Book, pp. 164-165, Dec. 2005.
Tipirneni, Koudymov, Adivarahan, Yang, Simin, Khan, "The 1.6 kV AlGaN/GaN HFETs", IEEE Electron Device Letters, V. 27, N9, 716-718, Sep. 2006.
Simin, Hu, Ilinskaya, Kumar, Koudymov, Zhang, Khan, Gaska, Shur, "7.5kW/mm2 current switch using AlGaN/GaN metal-oxide-semiconductor heterostructure field effect transistors on SiC substrates". Electronics Letters, V. 36, No. 24, pp. 2043-2044, 2000.
Anwar, Islam, and Webster, "Carrier Trapping and Current Collapse Mechanism in GaN Metal-Semiconductor Field Effect Transistors", Applied Physics Letters, V. 84, No. 11, pp. 1970-1972, Mar. 2004.
Nozaki, Feick, Weber, Micovic, and Nguen, "Compression of the DC Drain Current by Electron Trapping in AlGaN/GaN Modulation Doped Field-Effect Transistors", Applied Physics Letters, V. 78, No. 19, pp. 2896-2898, May 2001.
Dora, Chakraborty, McCarthy, Keller, DenBaars, Mishra, "High Breakdown Voltage Achieved on AlGaN/GaN HEMTs With Integrated Slant Field Plates", IEEE Electron Device Letters, V. 27, No. 9, pp. 713-715, Sep. 2006.
Tipirneni, Adivarahan, Simin, Khan, "Silicon Dioxide-Encapsulated High Voltage AlGaN/GaN HFETs for Power-Switching Applications", IEEE Electron Device Letters, V. 28, No. 9, pp. 784-786, Sep. 2007.
Saito, Nitta, Kakiuchi, Saito, Tsuda, Omura, Yamaguchi, "A 120-W Boost Converter Operation Using a High-Voltage GaN-HEMT", IEEE Electron Device Letters, V. 29, No. 1, pp. 8-10, Jan. 2008.
Karmalkar and Soudabi, "A Closed-Form Model of the Drain-Voltage Dependence of the OFF-State Channel Electric Field in a HEMT with a Field Plate", IEEE Transactions on Electron Devices, V. 53, No. 10, Oct. 2006 pp. 2430-2437.
Kosaka, Fujishima, Inoue, Hinoki, Yamada, Tsuchiya, Kikawa, Kamiya, Suzuki, Araki, Nanishi, "Temperature distribution analysis of AlGaN/GaN HFETs operated around breakdown voltage using micro-Raman spectroscopy and device simulation", Physica Status Solidi (c), V. 4, No. 7, pp. 2744-2747, Jun. 2007.
Gelmont, Shur, "Theory of Junction Between Two-Dimensional Electron Gas and p-Type Semiconductor", IEEE Transactions on Electron Devices, V. 39, No. 5, pp. 1216-1222, May 1992.
Simin, Koudymov, Tarakji, Hu, Yang, Khan, Shur, Gaska. "Induced strain mechanism of current collapse in AlGaN/GaN heterostructure field-effect transistors". Applied Physics Letters, V. 79, No. 16, pp. 2651-2653, 2001.
Koudymov and Shur, "Non-Ideal Current Transport in Heterostructure Field Effect Transistors", International Journal on High Speed Electronics and Systems, V. 18, No. 4, pp. 935-947, 2008.
Koudymov, Shur, Simin, Chu, Chao, Lee, Jimenez, Balistreri, "Analytical HFET 1-V model in presence of current collapse", IEEE Transactions on Electron Devices, V. 55, N. 3, pp. 712-720, May 2008.
Ramdani, Jamal, "Capacitively coupled field plate grid," Jun. 20, 2011, 10 pages.
Koudymov, Alexei, "Dynamic model of AlGaN/GaN HFET for high voltage switching," Solid-State Electronics, May 27, 2010, 6 pages.
Nakajima, Akira, et al., "GaN-Based Super Heterojunction Field Effect Transistors Using the Polarization Junction Concept," IEEE Electron Device Letters, Apr. 2011, 3 pages.
International Search Report and Written Opinion dated Oct. 2, 2013 issued in connection with corresponding International Patent Application No. PCT/US2013/048067 (10 pages total).
Nakajima, A. et al., "Novel field plate structure of AlGaN/GaN HEMTs", Physics State Solid C, vol. 4, No. 7, pp. 2736-2739 (2007). (4 pages total).
International Preliminary Report on Patentability dated Dec. 31, 2014 in connection with corresponding International Patent Application No. PCT/US2013/048067 (5 pages total).
Koudymov, Alexei, "Dynamic model of AlGaN/GaN HFET for high voltage switching," Solid-State Electronics, Solid-State Electronics 56 (2011) 135-140 (7 pages total).
Chinese Office Action dated Dec. 22, 2016, issued in connection with corresponding Chinese Patent Application No. 201380045298.1 (19 pages total).

* cited by examiner

SWITCHING DEVICE WITH CHARGE DISTRIBUTION STRUCTURE

CROSS-REFERENCE TO RELATED APPLICATION

This application is a continuation-in-part of U.S. Ser. No. 15/388,812, filed Dec. 22, 2016, entitled, "SWITCHING DEVICE WITH CHARGE DISTRIBUTION STRUCTURE" which is a continuation of U.S. Ser. No. 13/537,407, filed Jun. 29, 2012, entitled, "SWITCHING DEVICE WITH CHARGE DISTRIBUTION STRUCTURE". This application is related to U.S. Pat. Nos. 9,245,879 and 9,425,195, as well as copending U.S. patent application Ser. No. 15/218,145, filed Jul. 25, 2016 entitled "Static Discharge System", incorporated by reference herein in their entirety.

BACKGROUND

This invention is related to semiconductor devices. In particular, the invention is related to high voltage heterostructure field effect transistors (HFETs) that operate as power switches.

High voltage semiconductor switches are key components in electronic circuits for power conversion. Examples of these applications include power supplies for electronic equipment, drives for electric motors, and inverters for solar cells.

A power switch has an on state that allows the device to conduct current, and an off state that prevents the device from conducting current. When in the on state, a power switch may conduct tens or hundreds of amperes while the voltage across the switch is less than one volt. When in the off state, the power switch typically must withstand hundreds or thousands of volts while conducting substantially zero current. The voltage that the device can withstand in the off state while conducting no more than a given small value of current is sometimes referred to as the breakdown voltage.

It is usually desirable that the transition between the two states be as fast as possible because during the transition there may be relatively high current in the switch at the same time there is relatively high voltage across the switch. The presence of relatively high current and high voltage at the same time represents a loss of energy that at best is undesirable and at worst could destroy the switch.

High voltage HFETs are attractive for use as power switches primarily because they can change states substantially faster than other semiconductor switches that conduct the same currents at similar voltages. The materials used in the construction of HFETs also allow them to operate at higher temperatures than transistors that use traditional silicon-based technology.

A major problem with the fabrication of HFETs for power switches is that existing techniques produce devices with breakdown voltages that are substantially below the values that are theoretically possible. In addition, it is difficult to predict how the application of known techniques such as the use of field plates influences the breakdown voltage. As such, the design of devices for specific characteristics is difficult and time-consuming, requiring the application of cut-and-try methods to fabricate and test hardware rather than the use of computer modeling.

A solution is required that will allow power HFETs to be designed in less time for desired performance with predictable breakdown voltage.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
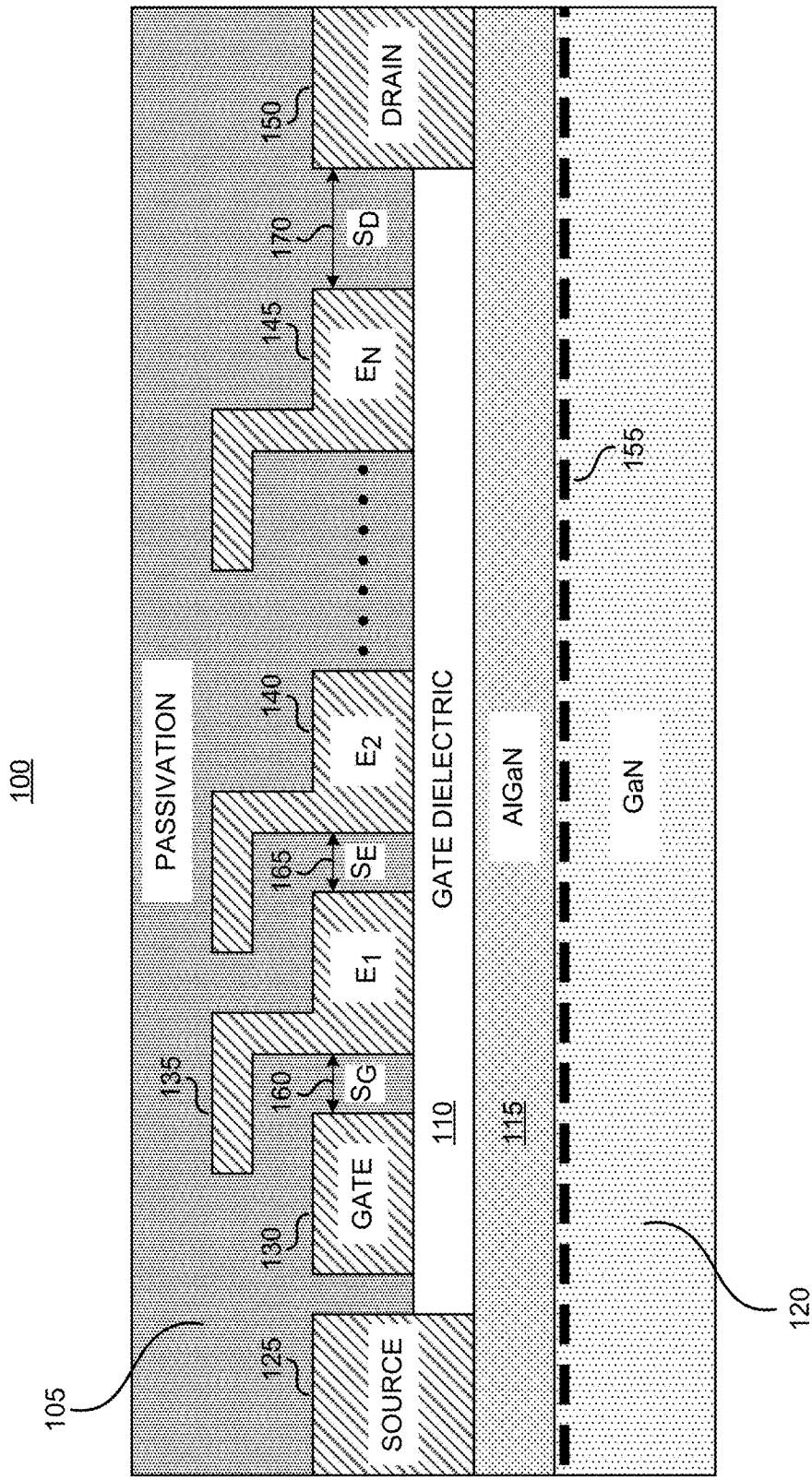
FIG. 1 is a cross-section of an example semiconductor device showing the components of an example charge distribution structure in accordance with the teaching of the present invention.

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The surface charge in a GaN HEMT must be distributed in a particular manner in order to achieve high breakdown voltages and avoid the deep traps ionization. If care is not taken of the surface charge, the deep traps ionization results in the absence of channel conduction during the switching from off-state to on-state. This effect is well known and is referred to as current collapse or dispersion. According to the present invention, in GaN HEMTs a lateral conductive channel (shown later in FIG. 1) may be formed below the source, gate, and drain (control) terminals of the HEMT. The length of the conductive channel may be from source to drain. Furthermore, a drift region may be formed below the gate and may span from the gate terminal to the drain terminal. In one aspect of the present invention, an HEMT may have a breakdown voltage which is proportional to the length of a drift region if in the OFF state. Also the space charge of the depletion region (a part of the drift region where the current carriers are flushed away) is compensated externally. Preferably, in one embodiment, the charge must be compensated by over 90%. The compensation naturally occurs during the deep traps and surface traps ionization; however, while turning the GaN HEMT back to the ON state, these states cannot be recharged back, which results in current collapse. It is important therefore to provide surface recharging by some other means. A charge distribution grid, in accordance with the present invention is designed to provide this charge.

A space charge compensation may be required in GaN devices in order to achieve higher breakdown voltages. Known references such as Solid-state electronics by E. Calleja, S. Christoloveanu, A. Zaslaysky, and Y Kuk (also attached) also state that without space charge compensation the breakdown field of GaN may be reached at drain biases as low as 25-40V. Those skilled in the art may appreciate that at these voltages, the length of a depletion region may not exceed 0.15-0.2 um. With 90% charge compensation, on the other hand, the depletion region may extend up to 1.5-2 um. Therefore, the charge distribution grid dimensions should not preferably exceed 2 microns. Furthermore, it may preferably be 1 micron.

FIG. 1 shows the salient features of an example semiconductor device that benefits from the teachings of the present invention. In particular, FIG. 1, which is not drawn to scale, is a cross-sectional view 100 through one part of a high voltage heterostructure field effect transistor (HFET). The example HFET illustrated in FIG. 1 comprises a first active layer 120 and a second active layer 115.

The first active layer 120 is typically disposed over a substrate (not shown in FIG. 1) that may be formed from various materials such as sapphire ($Al_2O_3$), silicon (Si), or silicon carbide (SiC) as is known in the art. Various techniques of fabrication may call for layers of other materials to be disposed between the substrate and the first active layer 120 to facilitate the construction of the device.

The first active layer 120 in the example of FIG. 1 is comprised of gallium nitride (GaN). In other examples, different semiconductor materials containing nitride compounds of other elements from Group III of the Periodic Table of the Elements may comprise the first active layer 120.

The second active layer 115 in the example of FIG. 1 is comprised of aluminum gallium nitride (AlGaN). In other examples, different Group III nitride semiconductor materials such aluminum indium nitride (AlInN) and aluminum indium gallium nitride (AlInGaN) may comprise the second active layer 115. The material of the second active layer 115 may be a non-stoichiometric compound. In such materials, the ratios of the elements are not easily represented by ordinary whole numbers. For example, the second active layer 115 may be a non-stoichiometric compound of a Group III nitride semiconductor material such as $Al_xGa_{1-x}N$ where $0<x<1$.

In the example of FIG. 1, a conductive source contact 125, a conductive gate contact 130, and a conductive drain contact 150 are disposed over the second active layer 115. Also shown in the sample of FIG. 1 are conductive components, also referred to as hooks, $E_1$ 135, $E_2$ 140, and $E_N$ 145 of a charge distribution structure that will be described in further detail later in this disclosure. The conductive components $E_1$ 135, $E_2$ 140, and $E_N$ 145 may be formed from an electrically conducting material or materials such as one or more metals, heavily doped semiconductors, and the like.

In the example HFET of FIG. 1, the components $E_1$ 135, $E_2$ 140, and $E_N$ 145 of the charge distribution structure are located between the gate contact 130 and the drain contact 150. In the example of FIG. 1, the component $E_1$ 135 of the charge distribution structure is laterally spaced from the gate contact 130 by a first distance $S_G$ 160. In the example of FIG. 1, the component $E_N$ 145 of the charge distribution structure is laterally spaced from the drain contact 150 by a second distance $S_D$ 170. In the example of FIG. 1, the second distance $S_D$ 170 is greater than the first distance $S_G$ 160. The spacing between any two components $S_E$ 165 of the charge distribution structure may be selected to achieve desired performance characteristics as described in detail later in this disclosure.

While the example HFET of FIG. 1 shows three conductive components forming the charge distribution structure, any suitable number of conductive components may be employed, including, in some cases, a single conductive component. Moreover, as shown in FIG. 1, in those implementations where multiple conductive components are employed, the conductive components may define a metal grid formed from a series of periodically repeating components which are identical to one another. In other examples, the conductive components need not periodically repeat, nor must they all be identical to one another. Rather, different conductive components may have different configurations, dimensions, and so on.

Also in the example HFET of FIG. 1, a gate dielectric layer 110 separates the gate contact 130 and the components $E_1$ 135, $E_2$ 140, and $E_N$ 145 of the charge distribution structure from the second active layer 115. A passivation layer 105 of a dielectric material is disposed around the contacts and above the gate dielectric layer 110 in the example HFET of FIG. 1. The passivation layer 105 provides stability of the electrical characteristics of the device by isolating the surface of the device from electrical and chemical contaminants in the environment.

In other examples that use different arrangements of passivation layers, the gate dielectric layer 110 is optional. In examples without the gate dielectric layer 110, the gate contact 130 forms a Schottky contact to the second active layer 115, and a separate passivation layer insulates the components $E_1$ 135, $E_2$ 140, and $E_N$ 145 of the charge distribution structure from the second active layer 115. A Schottky contact is a junction between a metal and a semiconductor that conducts current between the metal and the semiconductor in only one direction. Transistors without the gate dielectric layer are sometimes called Schottky gate transistors. An example of a construction that uses an optional gate dielectric layer is presented later in this disclosure.

The example HFET depicted in FIG. 1 is also known as a high electron mobility transistor (HEMT). In the HEMT of FIG. 1, the second active layer 115, which generally has a higher bandgap than the first active layer 120, gives rise to a layer of electric charge 155 in the first active layer 120 near the second active layer 115. The layer of electric charge 155 defines a lateral conductive channel. The first active layer 120 is sometimes called the channel layer. The second active layer 115 is sometimes called the barrier layer or the donor layer. The layer of electric charge 155 which defines the lateral conductive channel is sometimes called a two-dimensional electron gas (2 DEG) because electrons, trapped in the quantum well that results from the difference in the bandgaps, are free to move in two dimensions but are tightly confined in the third dimension. In one example, the length of the electric charge layer 155 and length of the conductive channel formed by the electric charge layer may be less than twenty five microns and more particularly, may be equal to twenty three microns. The length of the drift region which is formed below the gate 130 and which spreads from gate 130 to drain 150 is in this one example nineteen microns.

As discussed below, the two-dimensional electron gas is thought to arise at least in part from the presence of polarization charge in the second active layer 115. The illustrations and explanations that follow will distinguish polarization charge, surface charge, and the mobile charge of the 2 DEG in the HEMT.

When used as a power switch, source contact 125, gate contact 130, and drain contact 150 of the HFET are coupled through terminals to form electrical connections to external circuits. In operation, electric charge in the two-dimensional electron gas 155 moves in a channel between the source contact 125 and the drain contact 150 to become a current in an external circuit. The electric charge, and hence the current, is controlled by a voltage from an external circuit that is electrically connected between the gate contact 130 and the source contact 125.

As used in this disclosure, an electrical connection is an ohmic connection. An ohmic connection is one in which the relationship between the voltage and the current is linear and symmetric for both directions of the current. For example, two metal patterns that contact each through only metal are electrically connected. In contrast, the drain contact 150 and the source contact 125 are not electrically connected in the example HFET of FIG. 1 because any connection between these contacts is through a channel in the semiconductor and controlled by the gate contact 130. Similarly, the gate contact 130 is not electrically connected to the semiconductor 115 under the gate contact 130, and the gate contact 130 is not electrically connected to the 2 DEG 155 when a gate dielectric 110 is used to insulate the gate contact 130 from the semiconductor 115 beneath.

Figure 2:
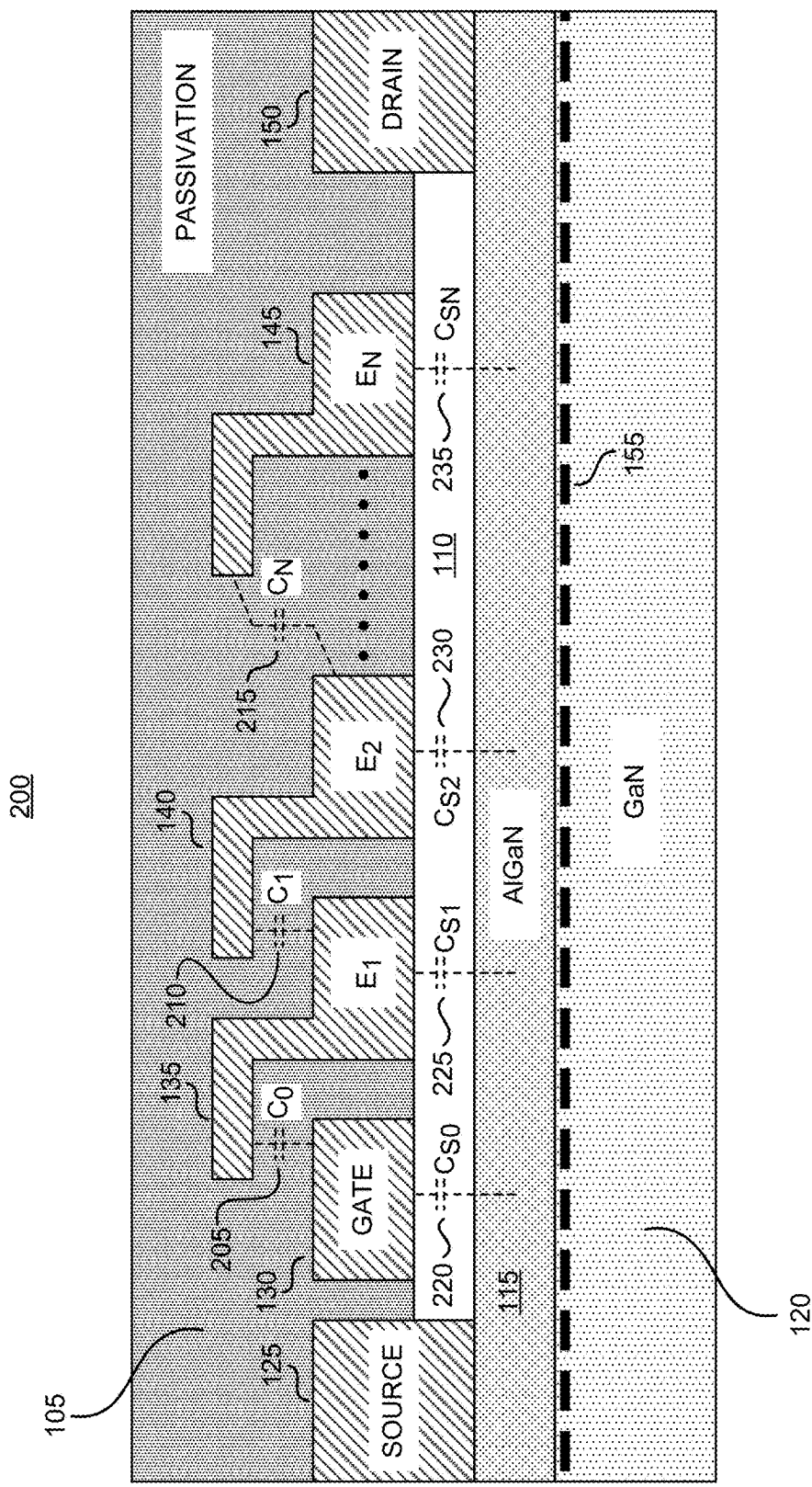
FIG. 2 is a cross-section of an example semiconductor device showing capacitance between components of an example charge distribution structure and an active layer in the semiconductor device in accordance with the teachings of the present invention.

FIG. 2 is a cross-sectional view 200 of the example HFET illustrated in FIG. 1 showing capacitors with dashed lines to represent capacitance between the individual components of the charge distribution structure and between those components and other parts of the device. It is appreciated that capacitance exists between every pair of objects that can possess an electric charge. FIG. 2 highlights the capacitance that is chiefly involved in the operation of the HFET with the charge distribution structure according to the teachings of the present invention.

Capacitance $C_0$ 205 represents the capacitive coupling between the gate contact 130 and component $E_1$ 135. Capacitance $C_1$ 210 represents the capacitive coupling between component $E_1$ 135 and component $E_2$ 140. Capacitance $C_N$ 215 represents the capacitive coupling between component $E_{N-1}$ ($E_2$ 140 in the example of FIG. 2) and component $E_N$ 145.

Capacitance $C_{SO}$ 220 represents the capacitive coupling between the gate contact 130 and the 2 DEG 155. Similarly, capacitances $C_{S1}$ 225, $C_{S2}$ 230, and $C_{SN}$ 235 represent the capacitive coupling between the 2 DEG 155 and components $E_1$ 135, $E_2$ 140, $E_N$ 145 respectively of the charge distribution structure.

Since the components of the charge distribution structure are coupled to other parts of the device by capacitance rather than by direct electrical connection, the individual components of the charge distribution structure can change their electrostatic potentials in response to changes in the voltages applied to the terminals of the device. Since the electrostatic potential of each component of the charge distribution structure may have a different value, the electrostatic potential along the 2 DEG 155 can be distributed relatively evenly to avoid undesirable effects of field crowding such as reduced breakdown voltage.

By redistributing electric charge in the presence of changing electric fields, each component of the capacitively-coupled charge distribution structure can match its potential with that of the portion of the conductive 2 DEG channel beneath it. This property distinguishes the capacitively-coupled charge distribution structure from conventional conductive field redistribution structures known as field plates that have the electrostatic potential firmly fixed at the potential of one of the device's terminals. Such field plates may form undesirable high magnitude electric fields near their edges.

Preferably the capacitance between the two neighboring conductive components follows the rule of a capacitive divider. In general, as known in the art, in a semiconductor device with conductive components, the area of the surface of a conductive component which is adjacent to a semiconductor surface may be referred to as a footprint of the conductive component. It may be appreciated by people skilled in the art that the capacitance between the semiconductor surface and the conductive component may be substantially related to the footprint of the conductive component. In one embodiment of the present invention it may be assumed that the period of the charge distribution structure is 3 microns (2 microns footprint and 1 micron spacing between the conductive components).

It may also be assumed in this embodiment that the desired channel voltage drop across one period of the charge distribution structure is 150V (which corresponds to an average channel field of 50V/um, or 0.5 MV/cm). It may further be assumed that the footprint of the charge distribution structure depletes the 2D gas in the HEMT channel vertically when a bias of e.g., −40V is applied to it. In the above example, the total amount of voltage across the capacitive divider comprised by the capacitance between $E_M$ and $E_{M+1}$ and the capacitance between $E_{M+1}$ and the channel may be substantially equal to 150V (the value of M can be between 1 and N−1, 1<M<N−1). The amount of voltage across the capacitance between $E_{M+1}$ and the channel is substantially equal to 40V. In other words, the required capacitance between $E_M$ and $E_{M+1}$ may be given by:

$$C(E_M\|E_{M+1})=(40V/150V)*C(E_{M+1}\|\text{channel})$$

The above may be achieved by providing a proper overlay area of the $E_{M+1}$ hook over $E_M$, or $E_M$ hook over $E_{M+1}$, or providing an overlay area externally (outside of the device active area). Given the capacitance needed, a person skilled in the art would be able to use the overlay area and dielectric thickness in order to obtain that capacitance value, following roughly the well-known expression for a flat capacitor:

$$C = A \times \varepsilon \times \frac{\varepsilon_0}{d}$$

where A is the overlay area, $\varepsilon$ is the dielectric constant of the dielectric, $\varepsilon_0$ is the dielectric permittivity of vacuum, and d is the dielectric thickness.

It should be noted that the example above demonstrates that in the disclosed embodiment of the present invention, capacitive coupling is not just provided, but is also engineered to obtain the desired channel voltage distribution.

Figure 3A:
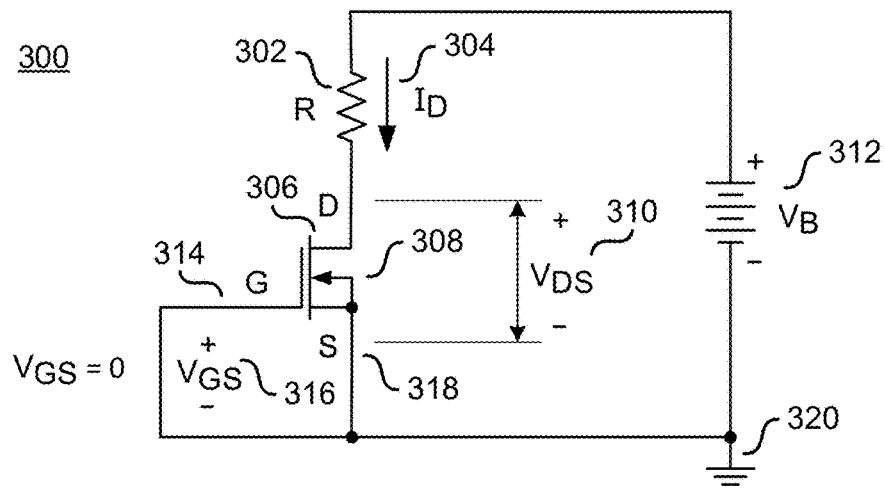
FIG. 3A is schematic diagram of an example circuit that includes a semiconductor device with a charge distribution structure in accordance with the teachings of the present invention under the conditions of constant voltage and current.

FIG. 3A is a schematic diagram 300 of an example circuit that includes a semiconductor device 308 with a charge distribution structure in accordance with the teachings of the present invention under the conditions of constant voltage and current. The semiconductor device 308 in FIG. 3A is an HFET switch with a drain terminal 306, a gate terminal 314, and a source terminal 318. Gate terminal 314 and source terminal 318 of HFET 308 in the example of FIG. 3A are electrically connected to a common return 320 such that the voltage $V_{GS}$ 316 between the gate 314 and the source 318 is zero.

The drain terminal 306 of HFET 308 in the example of FIG. 3A is coupled to one end of a resistor 302 that has a value R. The other end of resistor 302 is coupled to a terminal of a constant voltage source 312 that has a positive voltage of value $V_B$ with respect to the common return 320. Under the static conditions of the circuit in FIG. 3A, HFET 308 is in the on state, conducting a drain current $I_D$ 304 with voltage $V_{DS}$ 310 between the drain terminal 306 and the source terminal 318.

The example semiconductor device 308 is known as a depletion mode device because it requires a non-zero voltage on the gate terminal 314 with respect to the source terminal 318 to stop conduction of drain current $I_D$ 304. The normal state of a transistor is generally considered to be a state with no signal between the gate and the source. That is, a depletion mode device is considered to be normally on because it may conduct current when it has zero volts between gate and source. Depletion mode HFET devices require a negative voltage that is more negative than a threshold value between gate and source to stop conduction of drain current $I_D$ 304. A positive voltage between gate and source as well as zero voltage between gate and source will allow a depletion mode device to conduct. Conventional HFET devices are depletion mode devices.

Those skilled in the art will appreciate that the present invention may be applied to enhancement mode devices as well as to depletion mode devices. An enhancement mode device requires a non-zero voltage on the gate terminal 314 with respect to the source terminal 318 to allow conduction of drain current $I_D$ 304. That is, an enhancement mode device is considered to be normally off because it cannot conduct current when it has zero volts between gate and source. A negative voltage between gate and source will also keep an enhancement mode device off. The examples given in this disclosure with depletion mode devices may be applied to enhancement mode devices by altering the voltage between the gate and the source so that the gate is positive with respect to the source in the on state, and the gate is either negative or at the same potential as the source in the off state. Enhancement mode HFET devices require a positive voltage that is greater than a threshold value between gate and source to allow conduction drain current $I_D$ 304.

Figure 3B:
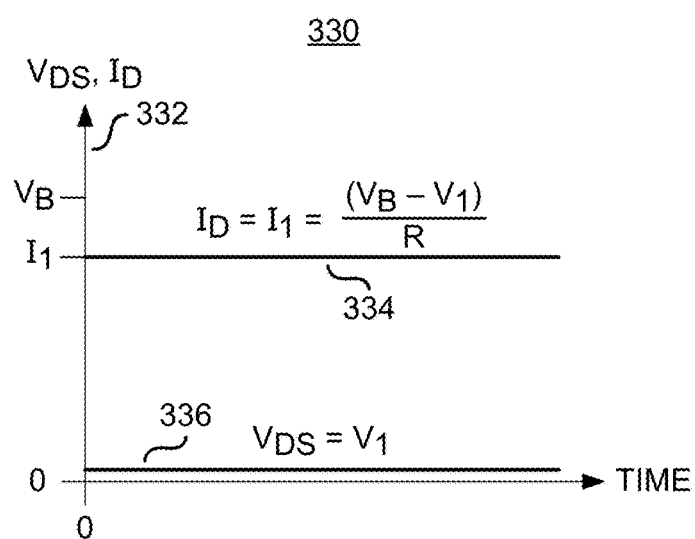
FIG. 3B is a graph that shows relative magnitudes of constant voltage and current in the example circuit of FIG. 3A.

FIG. 3B is a graph 330 showing the drain current $I_D$ 304 and voltage $V_{DS}$ 310 for the example circuit of FIG. 3A on the same vertical axis 332. The graph in FIG. 3B shows that the voltage $V_{DS}$ 310 is a constant value 336 that is much less than $V_B$, and that the current $I_D$ 304 is a constant value I1 334 that is the voltage across the resistor 302 divided by the resistance R. That is, $I1=(V_B-V1)/R$.

Figure 4:
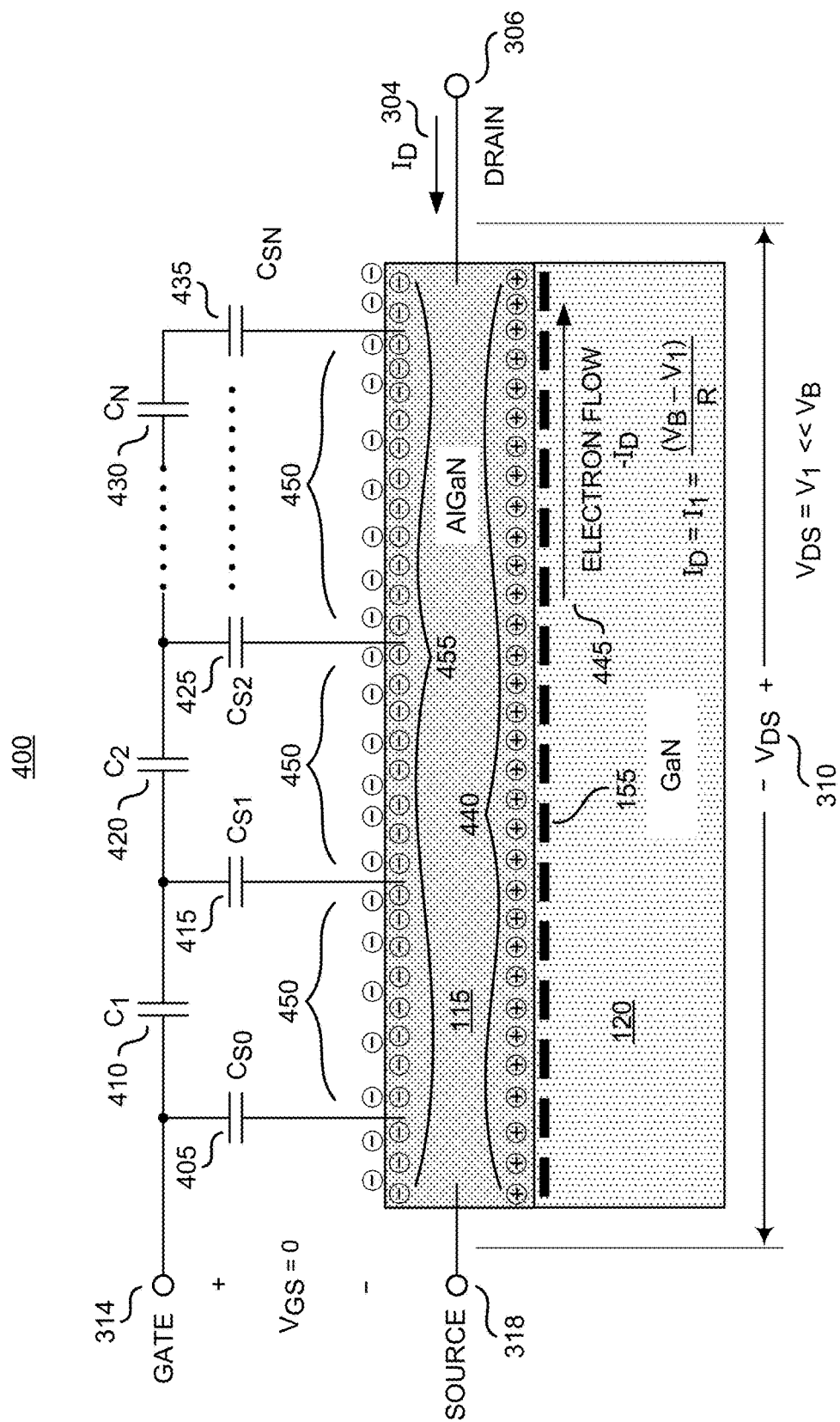
FIG. 4 is a cross-section of a portion of the example semiconductor device in the circuit of FIG. 3A generally illustrating the distribution of charge and capacitance for the conditions depicted in the graph of FIG. 3B.

FIG. 4 is a diagram 400 that shows a cross-section of a portion of the example HFET switch 308 in the example circuit of FIG. 3A generally illustrating the distribution of charge and capacitance for the conditions depicted in the graph of FIG. 3B. The mechanical representations of the conductive contacts have been omitted from FIG. 4 to allow better illustration of the electrical properties of the device.

In the diagram of FIG. 4, capacitors C1 410, C2 420, and CN 430 represent the capacitance between the conductive components of the charge distribution structure as shown in FIG. 2. Similarly, capacitors $C_{S1}$ 415, $C_{S2}$ 425, and $C_{SN}$ 435 in FIG. 4 represent the capacitance between the 2 DEG 155 and the components of the charge distribution structure as shown in FIG. 2. Capacitor $C_{S0}$ 405 in FIG. 4 represents a portion of the capacitance between the gate contact 130 and the 2 DEG 155 as shown in FIG. 2.

The operation of a HEMT involves interactions between electric charges that arise from multiple physical processes at multiple locations. This disclosure addresses only the charges that are essential to the understanding of the invention, with emphasis on the charges associated with the conduction of current in the capacitance between the conductive components of the charge distribution structure. All known charges are not shown explicitly in the diagrams to avoid unnecessary complexity. It is understood that within the entirety of the device there is an equality of positive and negative charges to make the device electrically neutral. In other words, a negative charge must be compensated by a positive charge somewhere in the device.

FIG. 4 shows examples of polarization charge, free mobile charge, and surface charge. Polarization charges 440 and 455 are examples of immobile charge within the second active layer 115. Positive polarization charge 440 near the boundary between the second active layer 115 and the first active layer 120 is compensated by negative polarization charge 455 below the upper surface of the second active layer 115. The origin of the polarization charge will be explained later in this disclosure. The 2 DEG 155 in the first active layer 120 is an example of free mobile charge that is negative because electrons carry a negative charge. Other mobile negative charges 450 that are also electrons are removed from the surface of the second active layer 115 to form a positive surface charge (not shown explicitly in FIG. 4) that compensates the negative charge of the 2 DEG 155.

FIG. 4 shows an electron flow 445 that is the result of the drain current $I_D$ 304. The electrons comprising the 2 DEG 155 move between the source terminal 318 and the drain terminal 306 when the switch 308 is conducting. The electron current 445 is in the opposite direction from the external drain current 304 because electrical current in a circuit is defined by convention to be the flow of positive charge, whereas the electrons have a negative charge. Thus, for electric current, movement of positive charge in one direction is equivalent to movement of negative charge in the opposite direction.

The behavior of an HFET may be understood from the interactions between electric fields and electric charges. An electrically neutral device has no net charge. In other words, every positive charge in an electrically neutral device has a corresponding negative charge so that the sum of the positive and negative charges is zero. Although the device may be electrically neutral, the positive and negative charges may not be uniformly distributed within the device. Electrical neutrality does not imply the absence of electric fields. The distribution of charges and the resulting electric fields are important because they influence the breakdown capability of the device.

In an electrically neutral HFET, mechanical forces that originate from the mismatch between the spacing between atoms in the different materials produce an electric field, sometimes called a piezoelectric field, which extends from the substrate to the surface of the device. The internal piezoelectric field acts on ionized donor atoms and polarization charges (bound charges rearranged into dipoles) to form a positive charge 440 in the second active layer 115 at the junction between the first active layer 120 and the second active layer 115. The electric field from the positive charges 440 attracts the negative charges of the electrons in the channel to the junction. In other words, the positive charge 440 is locally compensated by the negative charge from the two dimensional electron gas 155 that is necessary for the drain current $I_D$ 304.

To the extent that the positive charge 440 is due to polarization charge, which with the negative polarization charge 455 has a sum total charge of zero, the free electrons in the channel are globally uncompensated by the polarization charge. Since the layers in the HFET switch 308 are commonly undoped or doped only slightly (unintentionally), the electrons in the channel must be compensated in some other way. The compensation charge has been found to reside on the surface of the HFET switch 308. As shown in FIG. 4, negative charges 450 may be transferred between the surface of the HFET switch 308 and the ambient environment to leave a compensating positive charge (not explicitly shown) at the surface of the HFET switch 308. Without this compensation charge, the channel of the device would not be conducting.

Under dynamic conditions when the HFET switch 308 is changing from the on state to the off state, electrons in the two dimensional electron gas leave the channel between the source and the drain. Moreover, the charge in the channel may not be uniformly distributed between drain and source under dynamic conditions. If the positive compensation charge at the surface of HFET switch 308 remains fixed while the negative charge in the channel reduces, electric field gradients (the amount the electric field changes over a distance) may get high enough to damage the device. One purpose of the charge distribution structure is to facilitate charge transfer on the surface of the device to compensate the changing charge in the channel such that the electric field is spread more or less uniformly in the semiconductor material between the source and the drain.

Figure 5A:
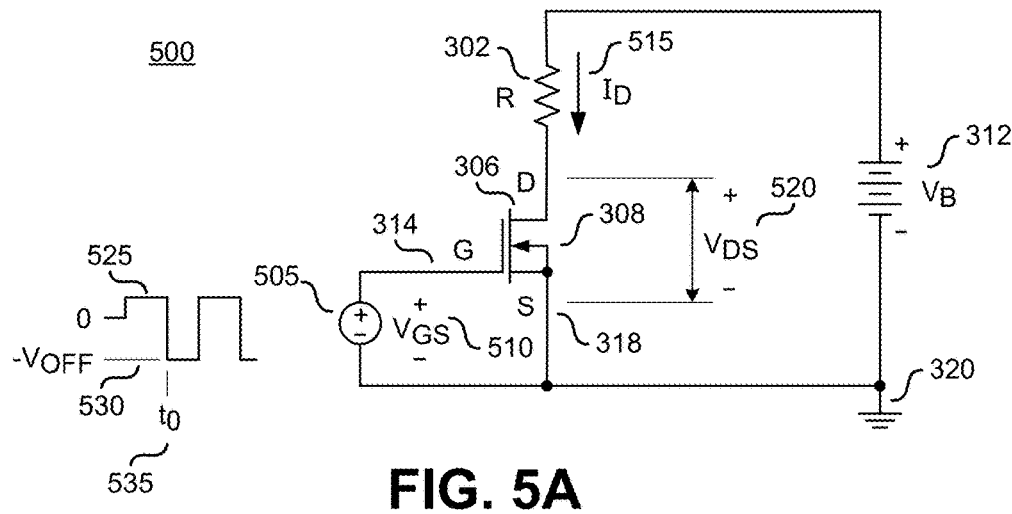
FIG. 5A is a schematic diagram of another example circuit that includes a semiconductor device with a charge distribution structure in accordance with the teachings of the present invention under the conditions of dynamic voltage and current.

FIG. 5A is a schematic diagram 500 that shows the example circuit of FIG. 3A modified for dynamic operation. A variable voltage source 505 is coupled between the gate terminal 314 and the source terminal 318 of HFET 308 in the example of FIG. 5A. Variable voltage source 505 changes the voltage $V_{GS}$ 510 between a negative value $-V_{OFF}$ 530 and a relatively small positive value 525. In the example of FIG. 5A, HFET 308 is in an on state when the voltage $V_{GS}$ 510 is at a value 525 greater than or equal to zero, and HFET 308 is in an off state when the voltage $V_{GS}$ 510 is at a negative value $-V_{OFF}$ 530 that is more negative than a threshold value. Once again, this discussed polarity corresponds to one example HFET which is normally on (depletion mode). For a normally off HFET (enhancement mode), the device would be in an off state when the voltage $V_{GS}$ 510 is less than or equal to a positive threshold value, and in an on state when the voltage $V_{GS}$ 510 is greater than the positive threshold value. In the example of FIG. 5A, HFET 308 switches from an on state to an off state at time to 535.

Figure 5B:
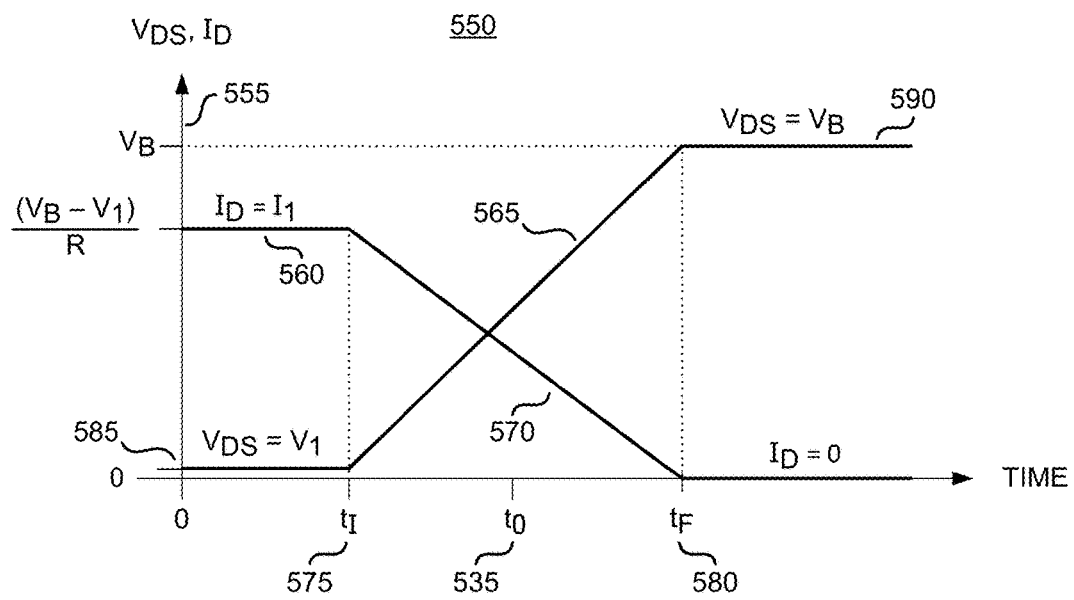
FIG. 5B is a graph that shows relative magnitudes of dynamic voltage and current in the example circuit of FIG. 5A.

FIG. 5B is a graph 550 that shows the drain current $I_D$ 515 and voltage VDS 520 of the example HFET switch 308 in the example circuit of FIG. 5A with respect to time in the vicinity of to 535. Current and voltage are plotted in FIG. 5B on the same vertical axis 555. The graph 550 shows that the transition between the on state and the off state takes place over a finite interval between an initial time t1 575 and a final time $t_F$ 580.

During the transition, the drain current 570 changes from a value $I_1$ 560 before time $t_1$ 575 to substantially zero after time $t_F$ 580. Also during the transition, the voltage 565 between the drain terminal 306 and the source terminal 318 changes from a value $V_1$ 585 before time $t_1$ 575 to a much higher value $V_B$ 590 after time $t_F$ 580.

It is appreciated that practical circuits have inductance that is not considered in the example circuit of FIG. 5A. If typical values of inductance were taken into account, the transition of drain current from the value $I_1$ 560 to substantially zero between time $t_1$ 575 and time $t_F$ 580 would raise the voltage between the drain terminal 306 and the source terminal 318 to a value substantially higher than the value $V_B$ of the voltage source 312. Thus, the breakdown voltage of a power switch typically must be much greater than the highest power supply voltage in the circuit.

Figure 6:
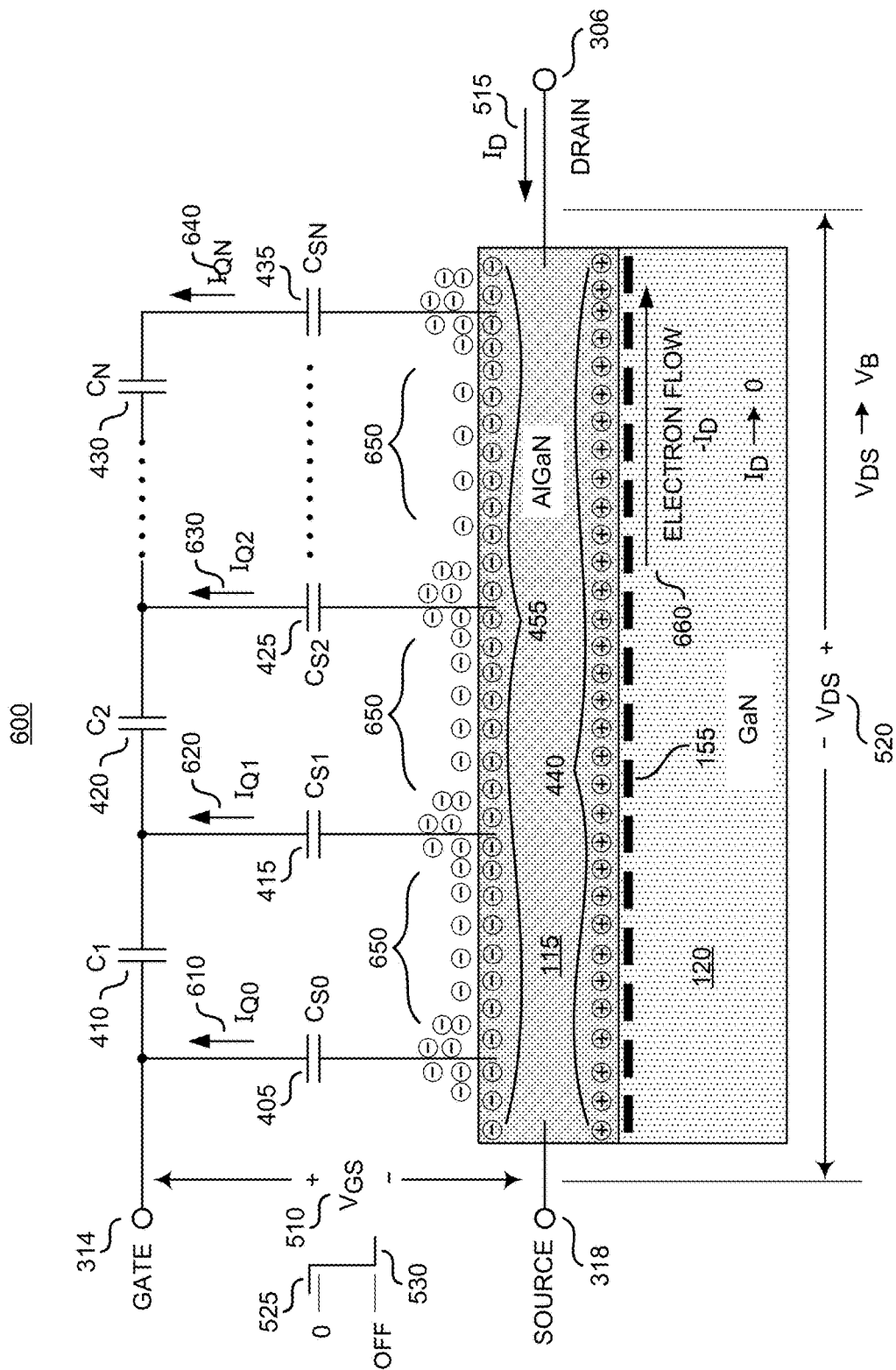
FIG. 6 is a cross-section of a portion of the example semiconductor device in the circuit of FIG. 5A generally illustrating the distribution of charge and capacitance for the conditions depicted in the graph of FIG. 5B.

FIG. 6 is a diagram 600 that shows the same cross-section as FIG. 4 under the dynamic conditions of the example circuit of FIG. 5A, generally illustrating the distribution of charge and currents for the conditions depicted in the graph of FIG. 5B. As in FIG. 4, the mechanical representations of the conductive contacts have been omitted to allow better illustration of the electrical properties of the device.

FIG. 6 shows the operation of the example capacitively-coupled charge distribution structure during the transition from the on state to the off state as illustrated in FIG. 5B between time $t_1$ 575 and time $t_F$ 580. As illustrated in FIG. 6, electron flow 660 and drain current $I_D$ 515 are decreasing toward zero as the voltage $V_{DS}$ 520 between the drain terminal 306 and the source terminal 318 is increasing toward the value $V_B$.

Electrons leave the two dimensional electron gas of the channel as the electron flow 660 decreases toward zero, making the charge in the channel less negative. As a consequence, the positive surface charge, which compensates for the electron gas of the channel, needs to be reduced. A reduction in positive charge at the surface is achieved by an increase in negative charge 650 at the surface. Accordingly, capacitors $C_{S0}$ 405, $C_{S1}$ 415, $C_{S2}$ 425, and $C_{SN}$ 435 conduct currents $I_{Q0}$ 610, $I_{Q1}$ 620, $I_{Q2}$ 630, and $I_{QN}$ 640, respectively, as electrons from the ambient environment accumulate to reduce the positive surface charge of the second active layer 115. A reduction in charge is sometimes referred to as a discharge. A restoration in charge is sometimes referred to as a recharge. The dynamic distribution of charge at the surface of second active layer 115 spreads the electric field in the material between the drain terminal 306 and the source terminal 318 more or less uniformly as the power switch makes the transition from the on state to the off state. Therefore, the charge distribution structure is configured to produce a surface discharge and a surface recharge on the HFET device during a switching transition of the device.

Similarly, as the HFET switch makes the transition from the off state to the on state, electrons enter the two dimensional electron gas of the channel as the electron flow 660 increases. As a consequence, the positive surface charge needs to increase in order to compensate for the increase in the electron gas of the channel. Accordingly, capacitors $C_{S0}$ 405, $C_{S1}$ 415, $C_{S2}$ 425, and $C_{SN}$ 435 conduct currents that transfer electrons from the surface of the HFET to the ambient environment, increasing the positive charge at the surface of the second active layer 115.

As previously mentioned, it is often desirable to make the transition between the off state and the on state as fast as possible. The speed of this transition is referred to as the switching speed of the device. If a signal were to drive the HFET at a rate faster than its switching speed, the device may experience premature breakdown, which can lead to irreversible device degradation. An important factor in determining the switching speed of the device is its surface discharge and recharge times, which will depend in part on the particular configuration that is used for the charge distribution structure. Accordingly, the charge distribution structure generally should be designed so that it produces a surface discharge and recharge at a rate that is greater than a design target switching speed.

Figure 7A:
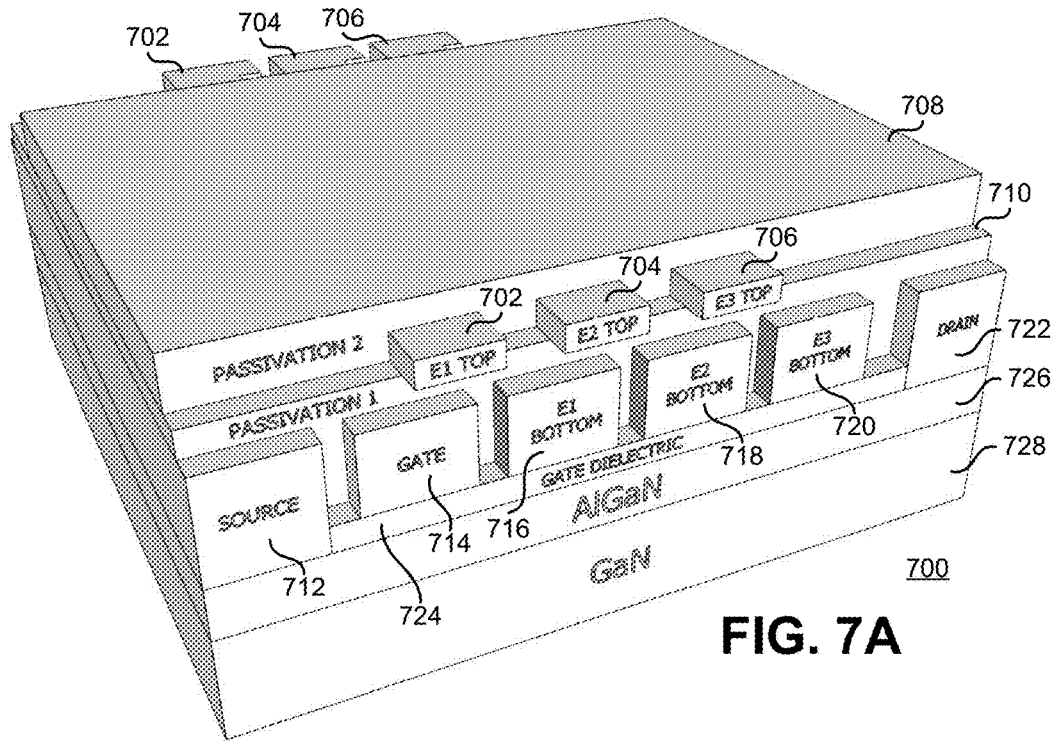
FIG. 7A is an illustration in a perspective view that shows the relative positions of various parts and features of an example semiconductor device that includes a charge distribution structure in accordance with the teachings of the present invention.
Figure 7B:
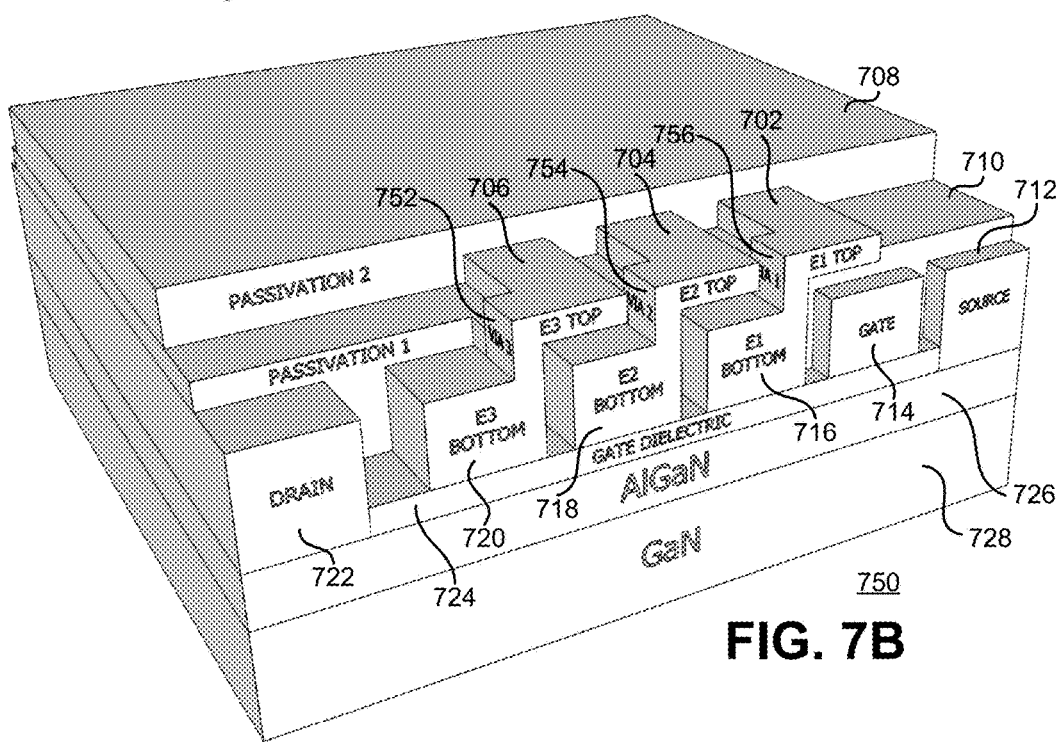
FIG. 7B is an illustration in a different perspective view of the example semiconductor device in FIG. 7A illustrating the relative positions of other parts and features not visible in the view of FIG. 7A.

FIG. 7A is a perspective view 700 showing the relative positions of various parts and features of an example HFET including a capacitively-coupled charge distribution structure in accordance with the teachings of the present invention. FIG. 7B is a different perspective view 750 of the device shown in FIG. 7A. The example semiconductor device shown in FIG. 7A and FIG. 7B is same type of device described in FIG. 1.

FIG. 7A and FIG. 7B illustrate how components of a charge distribution structure may be assembled from metal deposited during the fabrication of an HFET in accordance with the teachings of the present invention. Portions of some layers of the example device have been removed in FIG. 7A and FIG. 7B to expose underlying features in greater detail. All layers would normally cover the entire device, ending at the same vertical plane on each side of the device.

Consistent with the cross-section representation of FIG. 1, the face nearest the observer in the perspective view of FIG. 7A shows a first active layer 728, a second active layer 726, and a dielectric layer 724. FIG. 7A also shows a conductive source contact 712 and a conductive drain contact 722 deposited over the second active layer 726.

The gate dielectric 724 is deposited over the second active layer 726 between the source contact 712 and the drain contact 722. A conductive gate contact 714 is deposited over the gate dielectric layer 724. FIG. 7A and FIG. 7B show the passivation layer 105 illustrated in FIG. 1 as two layers of passivation, 708 and 710, to indicate that the passivation is deposited in two steps of the fabrication process.

A feature not apparent in the cross-section of FIG. 1 but shown clearly in FIG. 7A and FIG. 7B is that the example charge distribution structure is fabricated on two different layers. Horizontal components of the charge distribution structure are fabricated from conductive material of appropriate thickness, appearing as stripes in a conventional two-dimensional view from the top. In one example, the thickness of the stripes may be approximately the same dimension as the width of the stripes. While the examples discussed herein refer to the horizontal components as stripes, more generally the horizontal components may be elongate members having a wide variety of different cross-sectional shapes.

FIG. 7A shows top stripes 702, 704, and 706, which form one layer, and bottom stripes 716, 718, and 720, which form another layer of three conductive components of a charge distribution structure. For example, the conductive component E1 is constructed from two stripes 702 and 716 of conductive material. Likewise, the conductive component E2 is constructed from two stripes 704 and 718 of conductive material and the conductive component E3 is constructed from two stripes 706 and 720 of conductive material. As shown, the top stripe of one component of the charge distribution structure overlaps at least in part with the bottom stripe of an adjacent conductive component so that they are capacitively coupled to one another. For instance, top stripe 704 of component E2 overlaps with bottom stripe 716 of component E1 and top stripe 706 of component E3 overlaps with bottom stripe 718 of component E2. In addition, top stripe 702 of conductive component E1 overlaps with gate 714.

The top conductive stripe and the bottom conductive stripe of each conductive component may be separated along most of their lengths by an insulating passivation layer, and joined together only along a relatively small section of their respective lengths through a via in the insulating passivation layer.

FIG. 7B shows top stripe 702 joined to bottom stripe 716, top stripe 704 joined to bottom stripe 718, and top stripe 706 joined to bottom stripe 720 by respective conductive depositions 756, 754, and 752 through vertical vias in passivation layer 710 at one end of each stripe.

It is appreciated that a top stripe and a bottom stripe of a component of a charge distribution structure may be joined at any place between the ends of the stripes. They may be joined either within the active area of the semiconductor device or outside the active area of the semiconductor device.

The dimensions of the stripes and the distance between them may be chosen along with the electrical properties of the dielectric material to achieve a desired capacitance between the components of the charge distribution structure. For example, the spacing between the gate contact 714 and the drain contact 722 will be set by the magnitude of the electrical field deemed appropriate for the application, typically between 50 and 100 volts per micron for a GaN device. The lithographic technology selected for fabrication of the device will determine the minimum width of the stripes. Knowledge of the minimum width and the desired electric field allows the designer to compute the number of stripes and the spacing between them. The maximum number of stripes may be determined from the minimum width and the distance between the stripes necessary to achieve the desired magnitude of electrical field between the stripes. Using the assumption that the 2 DEG under each stripe will be depleted when the device is off, the designer can compute an amount of charge associated with each stripe. The capacitance between each bottom stripe and the channel beneath it can be computed from the voltage and the charge. The capacitance between the top stripe and the adjacent bottom stripe must be sufficiently greater than the capacitance between the bottom stripe and the channel to guarantee that the charge associated with the channel can be transferred between components of the charge distribution structure.

As discussed above, in one embodiment, the charge distribution structure generally should be designed so that it produces a surface discharge and recharge at a rate that is greater than a design target switching speed. The amount of discharge and recharge that is needed to achieve satisfactory results may be application-dependent. However, in general, the amount charge that is to be provided during the recharge process should be comparable to the space-charge that is present in the channel. In one particular embodiment the amount of discharge may be at least about 90% of the maximum surface charge that accumulates below the stripes of the charge distribution structure. Likewise, the amount of recharge may be at least about 90% of the maximum surface charge that accumulates below the stripes of the charge distribution structure. The amount of recharge is expected to be substantially equal to the amount of discharge during a switching cycle so that at the end of the switching cycle the device is returned to its state at the beginning of the switching cycle. Of course, the amount of discharge and recharge will be less at locations that are not directly below the stripes of the charge distribution structure. In order to compensate for surface charge that is depleted between stripes, in some embodiments the recharge may be greater than 100% of the maximum charge that accumulates below the stripes. In this way, charge can be distributed to those surface portions between the stripes.

Figure 8:
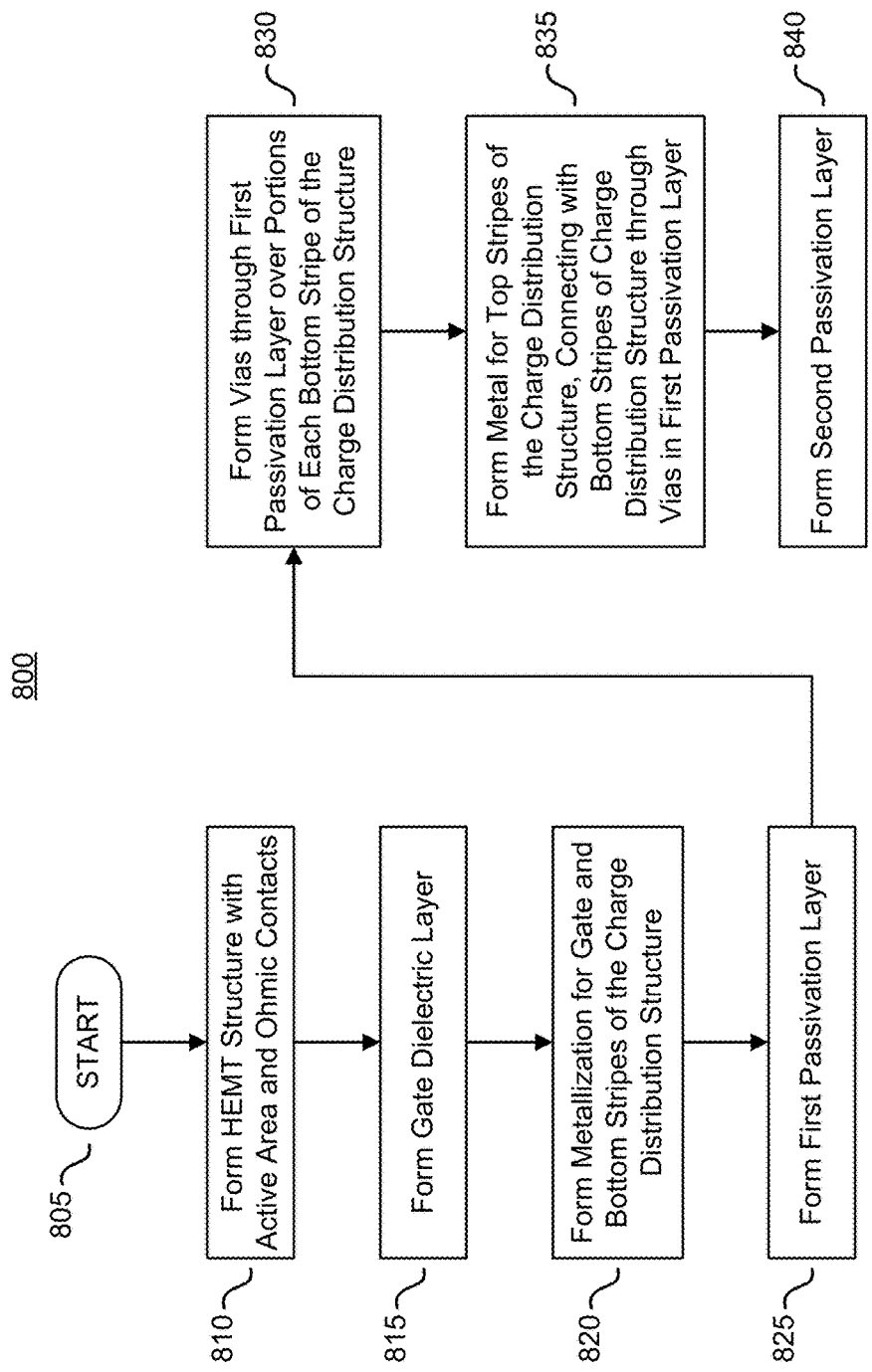
FIG. 8 is an example flow diagram illustrating generally a sample flow of operations in a process to construct the example semiconductor device illustrated in FIG. 7A and FIG. 7B with a charge distribution structure in accordance with the teachings of the present invention.

FIG. 8 is an example flow diagram illustrating generally a sample flow of operations in an example process to construct the example semiconductor device illustrated in FIG. 7 A and FIG. 7B with a charge distribution structure in accordance with the teachings of the present invention. After starting in block 805, a structure for a high electron mobility transistor (HEMT) is formed in block 810 with an active area and ohmic contacts for the drain and the source as is known in the art. A gate dielectric layer is then formed over the active area in step 815.

After the gate dielectric layer is formed in block 815, metallization for the gate and metallization for the bottom stripes of a charge distribution structure are formed over the gate dielectric layer in block 820. Next, in block 825, a first passivation layer is formed over the metal for the gate, the metal for the bottom stripes, and the contacts for the drain and source.

Vias are then formed through the first passivation layer in block 830 where it is desired to join the bottom stripes with top stripes to form components of the charge distribution structure. Metal is then deposited in block 835 on the surface of the first passivation structure and through the vias in the first passivation layer to form top stripes of the charge distribution structure that are joined to bottom stripes of the charge distribution structure. The process ends with the formation of a second passivation layer in block 840.

Figure 9A:
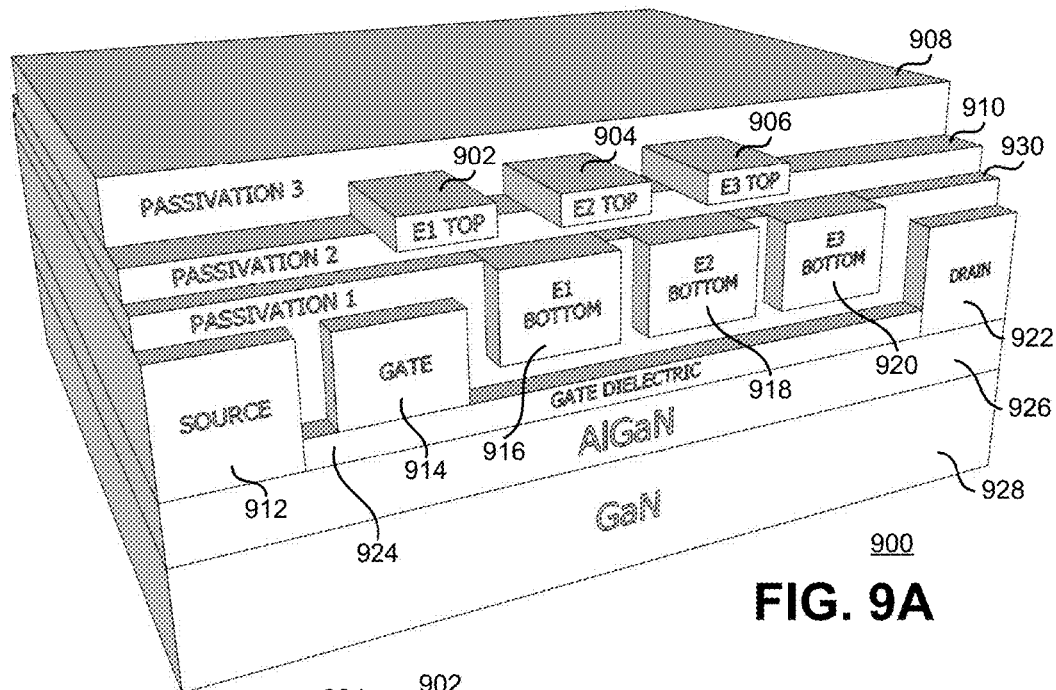
FIG. 9A is an illustration in a perspective view that shows the relative positions of various parts and features of another example semiconductor device that includes a charge distribution structure in accordance with the teachings of the present invention.
Figure 9B:
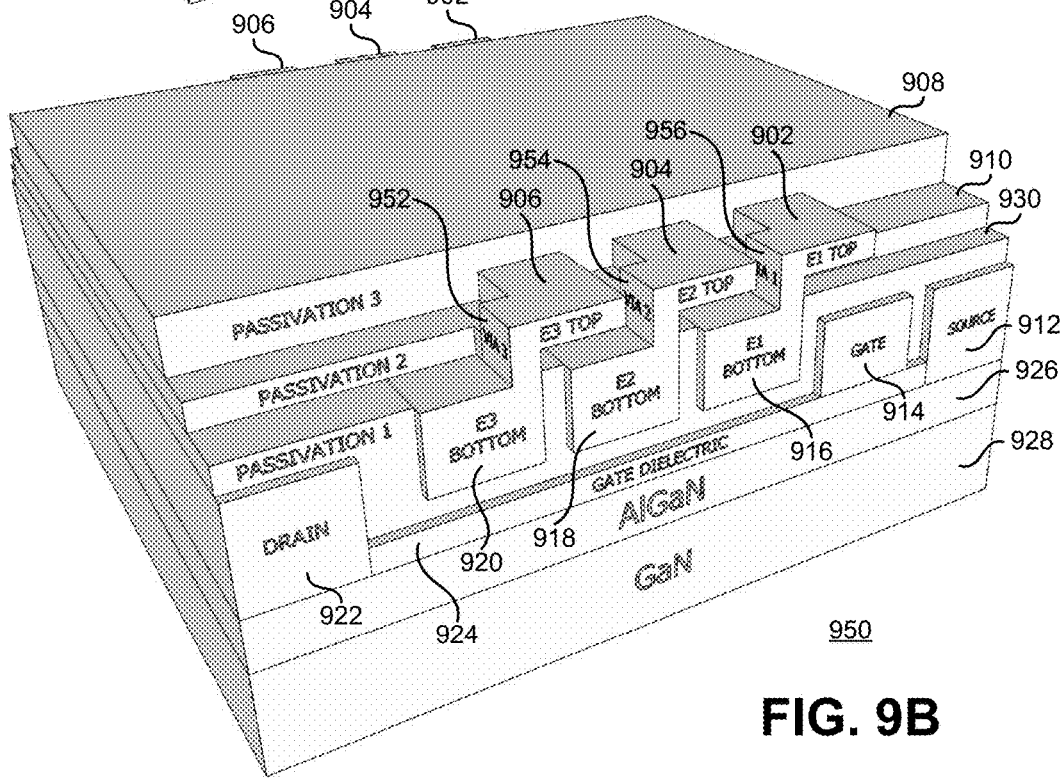
FIG. 9B is an illustration in a different perspective view of the example semiconductor device in FIG. 9A illustrating the relative positions of other parts and features not visible in the view of FIG. 9A.

FIG. 9A is a perspective view 900 showing the relative positions of various parts and features of another example HFET including a capacitively-coupled charge distribution structure in accordance with the teachings of the present invention. FIG. 9B is a different perspective view 950 of the device shown in FIG. 9A. The example semiconductor device shown in FIG. 9A and FIG. 9B has an additional layer of passivation that allows an optional gate dielectric layer, whereas the gate dielectric layer 724 is mandatory in the structure illustrated in FIG. 7 A and FIG. 7B. In examples without the gate dielectric layer 924, the gate contact 914 forms a Schottky contact to the second active layer 926, and the passivation layer 930 insulates the components E1 916, E2 918, and E3 920 of the charge distribution structure from the second active layer 926.

FIG. 9A and FIG. 9B illustrate how components of a charge distribution structure may be assembled from metal deposited during the fabrication of an HFET in accordance with the teachings of the present invention. As in FIG. 7 A and FIG. 7B, portions of some layers of the example device have been removed in FIG. 9A and FIG. 9B to expose underlying features in greater detail.

Similar to the views of FIG. 7A and FIG. 7B, the face nearest the observer in the perspective view of FIG. 9A shows a first active layer 928, a second active layer 926, and an optional dielectric layer 924. FIG. 9A also shows a conductive source contact 912 and a conductive drain contact 922 deposited over the second active layer 926.

The optional gate dielectric 924 is deposited over the second active layer 926 between the source contact 912 and the drain contact 922. A conductive gate contact 914 is deposited over the gate dielectric layer 924, followed by a first passivation layer 930 deposited over the gate contact 914, source contact 912, and drain contact 922. In examples that do not use the gate dielectric 924, gate contact 914 is deposited directly on the second active layer 926 to form a Schottky contact.

The first passivation layer 930 surrounds three sides of bottom stripes 916, 918, and 920 of the capacitively-coupled charge distribution structure, separating the bottom stripes from each other and from other parts of the device below and adjacent to the bottom stripes. FIG. 9A and FIG. 9B also show a second passivation layer 910 and a third passivation layer 908.

Similar to FIG. 7 A and FIG. 7B, the alternative construction of FIG. 9A shows top stripes 902, 904, and 906 with bottom stripes 916, 918, and 920 that form three components of a charge distribution structure. FIG. 9B shows top stripe 902 joined to bottom stripe 916, top stripe 904 joined to bottom stripe 918, and top stripe 906 joined to bottom beam 920 by respective conductive depositions 956, 954, and 952 through vertical vias in passivation layer 910 at one end of each stripe.

Figure 10:
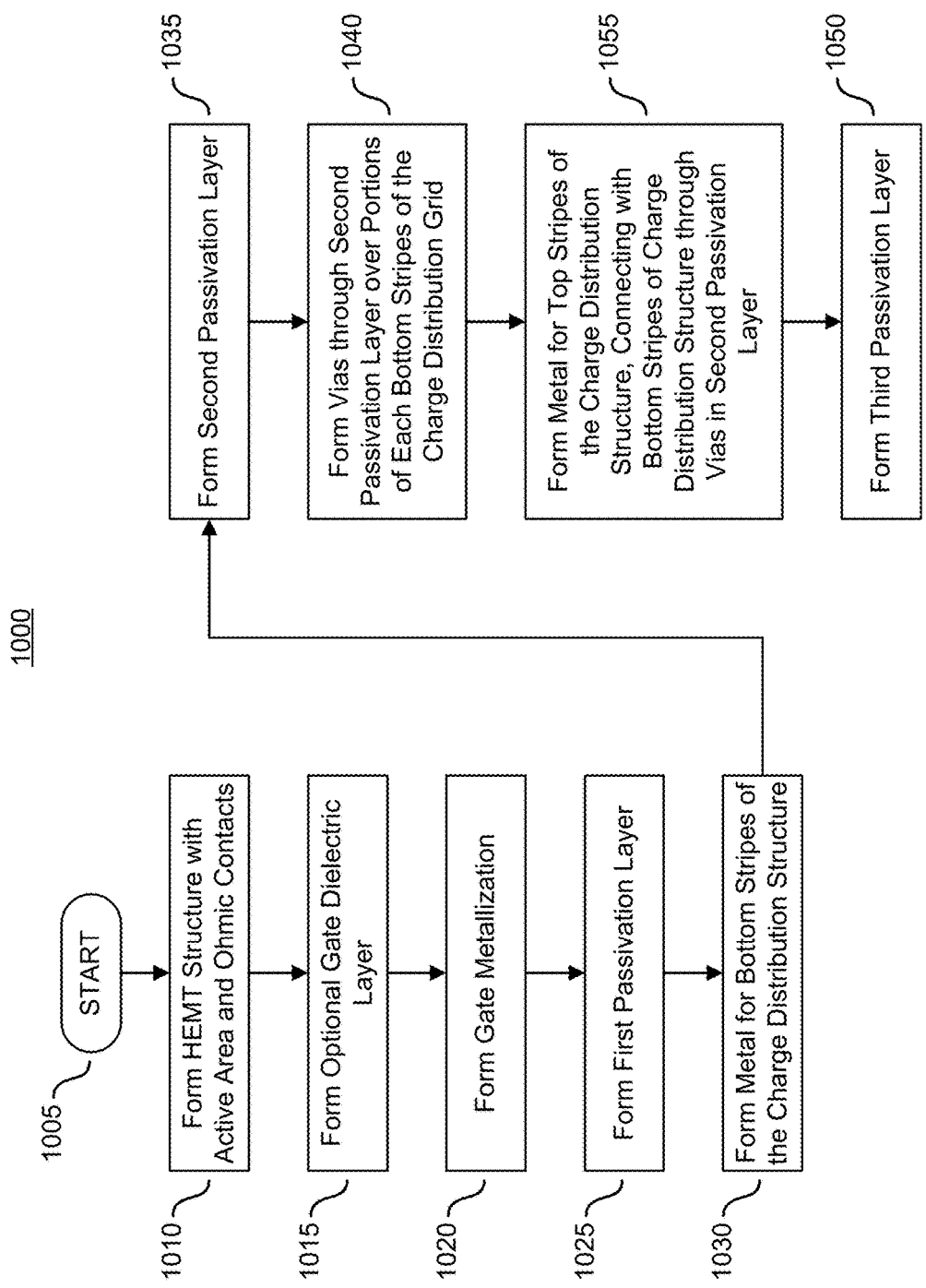
FIG. 10 is an example flow diagram illustrating generally a sample flow of operations in a process to construct the example semiconductor device illustrated in FIG. 9A and FIG. 9B with a charge distribution structure in accordance with the teachings of the present invention.

FIG. 10 is an example flow diagram illustrating generally a sample flow of operations in an example process to construct the example semiconductor device illustrated in FIG. 9A and FIG. 9B with a charge distribution structure in accordance with the teachings of the present invention. After starting in block 1005, a structure for a high electron mobility transistor (HEMT) is formed in block 1010 with active area and ohmic contacts for the drain and the source as is known in the art. An optional gate dielectric layer may then be formed over the active area in block 1015. Block 1015 is skipped in examples that do not use the optional gate dielectric layer.

After the completion of the operation in block 1015 in examples that use the optional gate dielectric layer, metallization for the gate is then formed in block 1020. Next, a first passivation layer is formed over the metal for the gate and the contacts for the drain and source in block 1025. The formation of the first passivation layer may include removal of passivation material to form footprints, which may also be referred to as channels, for the bottom stripes of the charge distribution structure. Then in block 1030 metal is deposited for the bottom stripes of the charge distribution structure, followed by a second passivation layer in block 1035.

Vias are then formed through the second passivation layer in block 1040 where it is desired to join the bottom stripes with top stripes to form components of the charge distribution structure. Metal is then deposited in block 1055 on the surface of the second passivation layer and through the vias in the second passivation layer to form top stripes of the charge distribution structure that are joined to bottom stripes of the charge distribution structure. The process ends with the formation of a third passivation layer in block 1050.

It should be noted that prototypes of HEMTs as taught by the disclosed specification were fabricated. The breakdown voltage was experimentally measured (in excess of 750V for 17 microns of the drift region), and the results were satisfactory. The results also indicated that $R_{DSON}$ of the HEMT was controlled well during the switching.

While the teachings of the present invention have been described above in the context of an HFET, these teachings may be used with other semiconductor devices as well. For example, the charge distribution structure of the present invention may be used with an inverted HFET, which is similar to an HFET except that the donor layer is formed below the channel layer instead of above the channel layer as in an HFET.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims.

What is claimed is:

1. A semiconductor device, comprising:
    a substrate;
    a first active layer disposed over the substrate;
    a second active layer disposed on the first active layer such that a lateral conductive channel arises between the first active layer and the second active layer;
    a source, gate and drain contacts disposed over the second active layer; and
    a conductive charge distribution structure disposed over the second active layer between the gate and drain contacts, said conductive charge distribution structure being coupled only capacitively to the gate contact, said conductive charge distribution structure including a plurality of components of said conductive charge distribution structure, a first charge distribution structure component of said conductive charge distribution structure being only capacitively coupled to the gate contact and a second charge distribution structure component of said conductive charge distribution structure being only capacitively coupled to the first charge distribution structure component, each of the first and second charge distribution structure components including a first elongate member formed in a first portion and a second elongate member formed in a second portion such that each of the first and second charge distribution structure components of the capacitively-coupled charge distribution structure matches its potential with that of corresponding portion of the lateral conductive channel beneath the first and second charge distribution structure components, respectively;
    wherein the length of the lateral conductive channel is less than twenty five microns.

2. The semiconductor device of claim 1, wherein said conductive charge distribution structure is laterally spaced from the gate contact by a first distance and said conductive charge distribution structure is spaced from the drain contact by a second distance greater than the first distance.

3. The semiconductor device of claim 1, further comprising a dielectric layer disposed between the second active layer and the conductive charge distribution structure.

4. The semiconductor device of claim 3, wherein said dielectric layer is further disposed between the second active layer and the gate contact.

5. The semiconductor device according to claim 1, wherein the first active layer comprises a group III nitride semiconductor material.

6. The semiconductor device according claim 5, wherein the first active layer comprises GaN.

7. The semiconductor device according to claim 1, wherein the second active layer comprises a group III nitride semiconductor material.

8. The semiconductor device according to claim 7, wherein the second active layer comprises $Al_xGa_{1-x}N$, wherein $0<x<1$.

9. The semiconductor device according to claim 7, wherein the second active layer is selected from the group consisting of AlGaN, AlInN, and AlInGaN.

10. The semiconductor device of claim 1, wherein at least one of the plurality of conductive elongate members in the first portion at least partially overlaps with one of the plurality of conductive elongate members in the second portion.

11. A field effect transistor (FET), comprising:
    a plurality of semiconductor layers disposed on a substrate;
    a source, drain and gate electrically coupled to the plurality of semiconductor layers; and
    a capacitively coupled charge distribution structure disposed over the plurality of semiconductor layers and being coupled only capacitively to the gate, said charge distribution structure being configured to produce a surface discharge on a surface portion of the transistor disposed between the gate and the drain during a transient from an on-state to an off-state and a surface recharge on said surface portion during a transient from the off-state to the on-state, the capacitively coupled charge distribution structure including a metal grid having a plurality of conductive elongate members disposed over said surface portion, said plurality of conductive elongate members being capacitively coupled to one another, each of the plurality of conductive elongate members including a first elongate member formed in a first portion and a second elongate member formed in a second portion such that each of the first and second elongate members of the capacitively-coupled charge distribution structure matches its potential with that of corresponding portion of the lateral conductive channel beneath the first and second elongate members, respectively;

wherein the length of the lateral conductive channel is less than twenty five microns.

12. The field effect transistor of claim 11, wherein said FET has a design target switching speed, said charge distribution structure being further configured to produce the surface discharge and recharge at a rate greater than the design target switching speed.

13. The field effect transistor of claim 11, wherein the plurality of conductive elongate members define a periodically repeating structure.

14. The field effect transistor of claim 11, wherein the plurality of conductive elongate members in a first set of elongate members are parallel to one another and the elongate members in a second set of elongate members are parallel to one another.

15. The field effect transistor of claim 11, wherein the surface discharge removes from said surface portion at least about 90% of a maximum charge established on said surface portion.

16. The field effect transistor of claim 15 wherein the surface recharge increases charge on said surface portion to at least 90% of the maximum charge.

17. The field effect transistor of claim 11, wherein the plurality of conductive elongate members are only capacitively coupled to one another.

18. A method of forming a semiconductor device, comprising:

forming a first active layer on a substrate;
forming a second active layer over the first active layer such that the first and second active layers give rise to a two-dimensional electron gas layer between the first active layer and the second active layer;
forming source, gate and drain contacts over the second active layer; and
forming a charge distribution structure over the second active layer between the gate and drain contacts so that the charge distribution structure is coupled only capacitively coupled to the gate contact, the charge distribution structure including a metal grid having a plurality of conductive elongate members disposed over a surface portion of the semiconductor device, said plurality of conductive elongate members being capacitively coupled to one another, each of the plurality of conductive elongate members including a first elongate member formed in a first portion and a second elongate member formed in a second portion such that each of the first and second elongate members of the capacitively-coupled charge distribution structure matches its potential with that of the portion of corresponding lateral conductive channel beneath the first and second elongate members, wherein the first elongate member in the first portion at least partially overlaps with the second elongate members of the plurality of conductive elongate members.

19. The method of claim 18, wherein the plurality of conductive elongate members are only capacitively coupled to one another.

* * * * *